United States Patent
Ozawa

(10) Patent No.: US 7,149,102 B2
(45) Date of Patent: Dec. 12, 2006

(54) SEMICONDUCTOR MEMORY DEVICE AND CONTROL METHOD FOR SEMICONDUCTOR MEMORY DEVICE

(75) Inventor: Takashi Ozawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 80 days.

(21) Appl. No.: 11/008,274

(22) Filed: Dec. 10, 2004

(65) Prior Publication Data

US 2006/0007756 A1 Jan. 12, 2006

(30) Foreign Application Priority Data

Jul. 12, 2004 (JP) .............................. 2004-204910

(51) Int. Cl.
*G11C 17/00* (2006.01)
(52) U.S. Cl. .................... 365/94; 365/189.07; 365/194
(58) Field of Classification Search ................. 365/94, 365/189.07, 194
See application file for complete search history.

(56) References Cited

U.S. PATENT DOCUMENTS

| | | | | |
|---|---|---|---|---|
| 4,972,378 | A | * | 11/1990 | Kitagawa et al. ...... 365/185.11 |
| 5,321,660 | A | * | 6/1994 | Sani et al. .................... 365/210 |
| 6,181,625 | B1 | * | 1/2001 | Hibino ......................... 365/210 |
| 6,456,166 | B1 | * | 9/2002 | Yabe ............................. 331/34 |
| 6,738,285 | B1 | * | 5/2004 | Tanizaki et al. ............. 365/158 |
| 6,956,779 | B1 | * | 10/2005 | Tran ............................ 365/205 |
| 6,982,914 | B1 | * | 1/2006 | Ohtsuki et al. .............. 365/210 |

FOREIGN PATENT DOCUMENTS

| | | |
|---|---|---|
| JP | 2003-36678 | 2/2003 |
| JP | 2003-141876 | 5/2003 |

* cited by examiner

*Primary Examiner*—Hoai V. Ho
(74) *Attorney, Agent, or Firm*—Arent Fox PLLC

(57) ABSTRACT

Provided is a semiconductor memory device using a single-bit line method that determines read operation timing in accordance with operation of a replica bit line. Further provided is a control method for the semiconductor memory device. Even when a transistor property fluctuation has occurred, the semiconductor memory device and the control method are capable of preventing, for example, increases in access time and circuit size and concurrently capable of reducing the occurrence probability of data readout error. The gate lengths of replica memory cell transistors are set as being values greater than the gate length of memory cell transistors. Thereby, a distribution center of a current drive capability distribution of the replica memory cell transistors is set lower than a distribution center of a current drive capability distribution of the memory cell transistors. Consequently, an occurrence probability of a delay in a voltage-fall start time on a regular data line can be reduced to be lower in comparison to a transmission timing of a latch control signal.

14 Claims, 11 Drawing Sheets

DIAGRAM SHOWING READ-ONLY MEMORY CIRCUIT 1 DIRECTED TO FIRST EMBODIMENT

DIAGRAM SHOWING READ-ONLY MEMORY CIRCUIT 1 DIRECTED TO FIRST EMBODIMENT

FIG. 2 DIAGRAM SHOWING CURRENT DRIVE CAPABILITY DISTRIBUTIONS OF MEMORY CELL TRANSISTORS AND REPLICA MEMORY CELL TRANSISTORS

TIMING DIAGRAM OF READ-ONLY MEMORY ("ROM") CIRCUIT 1

FIG. 4 DIAGRAM SHOWING READ-ONLY MEMORY CIRCUIT 1a DIRECTED TO SECOND EMBODIMENT

TIMING DIAGRAM OF READ-ONLY MEMORY ("ROM") CIRCUIT 1a

DIAGRAM SHOWING READ-ONLY MEMORY CIRCUIT 1c DIRECTED TO THIRD EMBODIMENT

DIAGRAM SHOWING PART OF MULTIPORT SRAM 1d HAVING READ-ONLY PORTS

DIAGRAM SHOWING CONVENTIONAL READ-ONLY MEMORY CIRCUIT 100 USING REPLICA BIT LINE

TIMING DIAGRAM (1/3) OF CONVENTIONAL READ-ONLY MEMORY CIRCUIT 100

TIMING DIAGRAM (2/3) OF CONVENTIONAL READ-ONLY MEMORY CIRCUIT 100

TIMING DIAGRAM (3/3) OF CONVENTIONAL READ-ONLY MEMORY CIRCUIT 100

SEMICONDUCTOR MEMORY DEVICE AND CONTROL METHOD FOR SEMICONDUCTOR MEMORY DEVICE

CROSS-REFERENCE TO RELATED APPLICATIONS

This application is based upon and claims the benefit of priority from each of the prior Japanese Patent Application No. 2004-204910 filed on Jul. 12, 2004, the entire contents of which are incorporated herein by reference.

BACKGROUND OF THE INVENTION

1. Field of the Invention

The invention relates to a semiconductor memory device in which data read timing is determined by operation of replica bit lines. The invention further relates to a control method for the semiconductor memory device.

2. Description of Related Art

FIG. 8 shows a portion of a conventional read-only memory ("ROM") circuit 100 using replica bit lines. The ROM circuit 100 has regular bit lines BL, regular data lines DL, replica bit lines RBL, and replica data lines RDL. Replica memory cells RC1 to RCn (n=natural number) are connected to each of the replica bit lines RBL, and memory cells C1 to Cn are connected to each of the regular bit lines BL. The source of a memory cell transistor BM1 of the memory cell C1 is connected to a ground voltage VSS, in which data "0" is retained. The sources of memory cell transistors BM2 and BMn of the memory cells C2 and Cn are set to a floating state, in which data "1" is retained. The sources of replica memory cell transistors RM1 to RMn of the replica memory cells RC1 to RCn are all coupled to the ground voltage VSS.

By reference to a timing diagram shown in FIG. 9, operation of the ROM circuit 100 will be described hereinafter. In a time period P1, the memory cell C1 retaining data "0" is selected. Upon completion of precharging (at time T11), the replica bit line RBL and the regular bit line BL are charged to a first precharge voltage value PV1 indicative of data "0". In addition, a replica data line RDL and a regular data line DL are charged to the level of a power source voltage VCC. Upon completion of the precharging (after the time T11), the voltage value on the replica data line RDL and the regular data line DL begins to drop. Then, when the replica data line RDL has dropped to the level of a predetermined voltage value, a latch control signal LCS is transmitted (arrow YY11). With the latch control signal LCS being used as a trigger, data flowing on the regular data line DL is latched in a latch section 103 (arrow YY12). In this case, the voltage value on the regular data line DL is low, so that data "0" is latched.

On the other hand, in a period P2, the memory cell C2 retaining data "1" is selected. Upon completion of precharging (at time T21), the regular bit line BL is precharged to a second precharge voltage value PV2 (higher than the first precharge voltage value PV1) that is indicative of data "1". Then, upon completion of the precharging (after the time T21), the voltage value of the replica data line RDL begins to drop; however, the voltage value of the regular data line DL does not begin to drop. Then, a latch control signal LCS is transmitted (arrow YY21), data flowing on the regular data line DL is latched with the latch control signal LCS being used as a trigger (arrow YY22). In this case, the voltage value of the regular data line DL is not decreased low, so that data "1" is latched.

Thus, using the replica bit line RBL, the readout of data "0" is thus performed for each communication, and the latch control signal LCS (signal to control a latch circuit for bit line readout data) is transmitted from a latch control circuit 102 with the readout completion timing (time T12, T22). Then, in the latch section 103, the data on the regular data line DL is latched in response to the latch control signal LCS and is output. That is, the replica data line RDL has the functionality of determining the timing of latching the data on the regular data line DL into latch section 103 by performing the readout of data "0" for each communication. Other examples of semiconductor memory devices using replica bit lines are disclosed in Japanese Unexamined Patent Application Publication No. 03-141876.

SUMMARY OF THE INVENTION

However, conventional semiconductor memory devices of the above-described type have problems pending resolution. The problems will be described hereinbelow by reference to a timing diagram shown in FIG. 10. A case will be described in which the transistor property fluctuation increase as the degree of device miniaturization and the like increases, thereby causing a combination of cases where the transistor property fluctuates in the direction along which a threshold voltage value RVth of the replica memory cell transistor RM1 on the replica bit line RBL becomes shallower and where the transistor property fluctuates in the direction along which the threshold voltage value Vth of the memory cell transistor BM1 on the regular bit line BL becomes deeper. In this case, the voltage value of the replica bit line RBL becomes a first precharge low voltage value PV1L (value lower than the first precharge voltage value PV1), falling of the voltage value on the replica data line RDL after time T11a becomes faster than in a regular mode (region R1). Thereby, transmission timing (time T12a) of the latch control signal LCS becomes faster than transmission timing (time T12 in FIG. 9) in the regular mode.

On the other hand, the voltage value of the regular bit line BL becomes a first precharge high voltage value PV1H (value higher than the first precharge voltage value PV1 and lower than the second precharge voltage value PV2). The voltage value of the regular data line DL begins to decrease from a time point (time T13a) when the voltage value of the regular bit line BL decreases to the first precharge voltage value PV1, so that the voltage-value fall start timing becomes later than a voltage-value fall start timing in the regular mode (time T11 in FIG. 9) (region R2). Thereby, the data on the regular data line DL is latched at the rise time (time T12a in FIG. 10) of the latch control signal LCS. In this event, since the voltage-value fall start timing is slow, the voltage value of the regular data line DL is remained at the power source voltage VCC, data "1" is read out from the line. However, since data required to be read out is "0", a data readout error occurs.

More specifically, when the transistor property fluctuates in the direction along which the threshold voltage value RVth of the replica memory cell transistor RM1 becomes shallower, the transmission timing of the latch control signal LCS is advanced. On the other hand, when the transistor property fluctuates in the direction along which the threshold voltage value Vth of the memory cell transistor BM1 becomes deeper, a voltage-value fall start time point on the regular data line DL is delayed, so that data "0" on the regular data line DL cannot be read out with the associated timing. This causes readout error and makes the semiconductor memory device to be a defective product, whereby to reduce the production yield.

By way of another example, a method for preventing data readout error has been proposed in Japanese Unexamined Patent Application Publication No. 2003-141876. The method is configured such that a delay device is provided that delays transmission timing (time T12a) of the latch control signal (LCS) that is determined corresponding to the operation of the replica bit line, whereby to set an allowance time for the delay in the operation of the regular bit line (BL). Further, a method has been proposed in which a gate threshold value of an inverter (104) connected to the replica data line (RDL) is offset to the "L" side, whereby to delay the transmission timing of the latch control signal (LCS), which is transmitted from the latch control circuit (102), whereby to set an allowance time for the delay in the operation of the regular bit line (BL). However, in the event that the delay time (time from time T11a to T13a in the region R2 in FIG. 10) in the operation of the regular bit line BL is very long, the delay cannot be sufficiently corrected with the allowance time in accordance with timing correction. This causes data readout error and makes the semiconductor memory device to be a defective product, whereby to reduce the production yield.

Another case will be described herebelow with reference to FIG. 11. In this case, in the period P1 in which the memory cell C1 (data "0") is selected, the fluctuation occurs in the direction along which the threshold voltage value RVth of the replica memory cell transistor RM1 on the replica bit line RBL becomes deeper. The voltage value on the post-precharge replica bit line RBL becomes a first precharge high voltage value PV1H (at time T11b). The voltage value of the replica data line RDL is late to fall since it does not begin to fall (region R4) until the voltage value on the replica bit line RBL falls to the level of a first precharge voltage value PV1 (time T13b) from the first precharge high voltage value PV1H (time T11b). There occurs a problem in that transmission timing (time T12b) of the latch control signal LCS becomes slower than the regular transmission timing, thereby increasing the access time. Thus, when the fluctuation occurs in the direction along which the threshold voltage value RVth on the replica memory cell transistor RM1 becomes deeper, the transmission timing of the latch control signal LCS is delayed, whereby to cause the phenomenon of increasing the access time.

In addition, the transistor property fluctuation causing problems as described above, that is, the data readout error and increase in the access time, are promoted as the device miniaturization advances. However, when devices are enlarged in size to restrain the transistor property fluctuation, another problem arises in that advantages of the device miniaturization cannot be attained, and the circuit size is increased, thereby leading to, for example, increases in cost and consumptive current.

The invention is made to solve at least one of the problems with the conventional art described above. Accordingly, an object of the invention is to provide a semiconductor memory device that even when the transistor property fluctuation has increased due to the device miniaturization, is capable of preventing, for example, increases in access time, circuit size, cost, and consumptive current, and concurrently capable of reducing the occurrence probability of data readout error. Another object of the invention is to provide a control method for the semiconductor memory device.

In order to achieve the above-described objects, according to a first aspect of the invention, a semiconductor memory device is provided that comprises at least one of replica memory cells corresponding to memory cells, wherein in the event of a readout operation for memory data stored corresponding to a value of current in the memory cell, a data readout timing for readout from the memory cell is set corresponding to the readout operation on the corresponding replica memory cell, wherein a current drive capability of the replica memory cell is set lower than a current drive capability of the memory cell.

Thus, at least one of the replica memory cells are provided corresponding to memory cells. The memory cell stores the memory data corresponding to the value of current in the memory cell. The data readout timing for readout from the memory cell is set in accordance with the readout operation on the corresponding replica memory cell. The current drive capability of the replica memory cell is set lower than the current drive capability of the memory cell.

Accordingly, a current drive capability distribution of the replica memory cell transistors is lower than a current drive capability distribution of the memory cell transistors. Thereby, even when the transistor property fluctuation is increased by device miniaturization and the like, an occurrence probability of a cell combination reducing the current drive capability of the memory cell transistor in comparison with the current drive capability of the replica memory cell transistor (that is, an occurrence probability of readout error) can be reduced.

When the device miniaturization is advanced, the transistor property fluctuation is increased. When the transistor property fluctuation is increased, the occurrence probability of the data readout error is increased, therefore presenting an impediment for the device miniaturization. However, according to the first aspect of the invention, even when the transistor property fluctuation has increased, the distribution is shifted so that the current drive capability distribution of the replica memory cell transistors is reduced to be lower than the current drive capability distribution of the memory cell transistors. Thereby, the data readout error can be prevented. Consequently, further device miniaturization can be implemented, thereby making it possible to implement reductions in the circuit size, cost, and consumptive current.

According to a second aspect of the invention, a semiconductor memory device is provided that comprises at least one of replica memory cells corresponding to memory cells, wherein in the event of a readout operation for memory data stored corresponding to a value of current in the memory cell, a data readout timing for readout from the memory cell is set corresponding to the readout operation on the corresponding replica memory cell, wherein the replica memory cell is correlated with a plurality of the memory cells.

Thus, the replica memory cell is correlated with the plurality of memory cells. That is, the number of the replica memory cells is smaller than the number of the memory cells. For example, all memory cells provided in one bit line may be correlated with one replica memory cell. The data readout timing for readout from the plurality of memory cells is set corresponding to the readout operation on the corresponding replica memory cell.

A problem occurs in that because of the transistor property fluctuation and the like, as the current drive capability of the replica memory cell transistor becomes higher than the current drive capability of the memory cell transistor, the data readout error proportionally increasingly occurs. In addition, a problem occurs in that as the current drive capability of the replica memory cell transistor becomes lower than the current drive capability of the memory cell transistor, the access time is proportionally increased. Further, a problem occurs in that as the number of the replica memory cells increases, the occurrence probability of the problems described above is increased, and the probability of causing semiconductor memory devices to be defective is increased.

As such, in the invention, the configuration is arranged such that at least one of replica memory cells are correlated with a plurality of memory cells, thereby reducing the number of replica memory cells [o1] required. This enables reducing, for example, the occurrence probability of increasing the access time and the occurrence probability of the data readout error, consequently enabling the problems described above to be prevented.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF PREFERRED EMBODIMENTS

Figure 1:
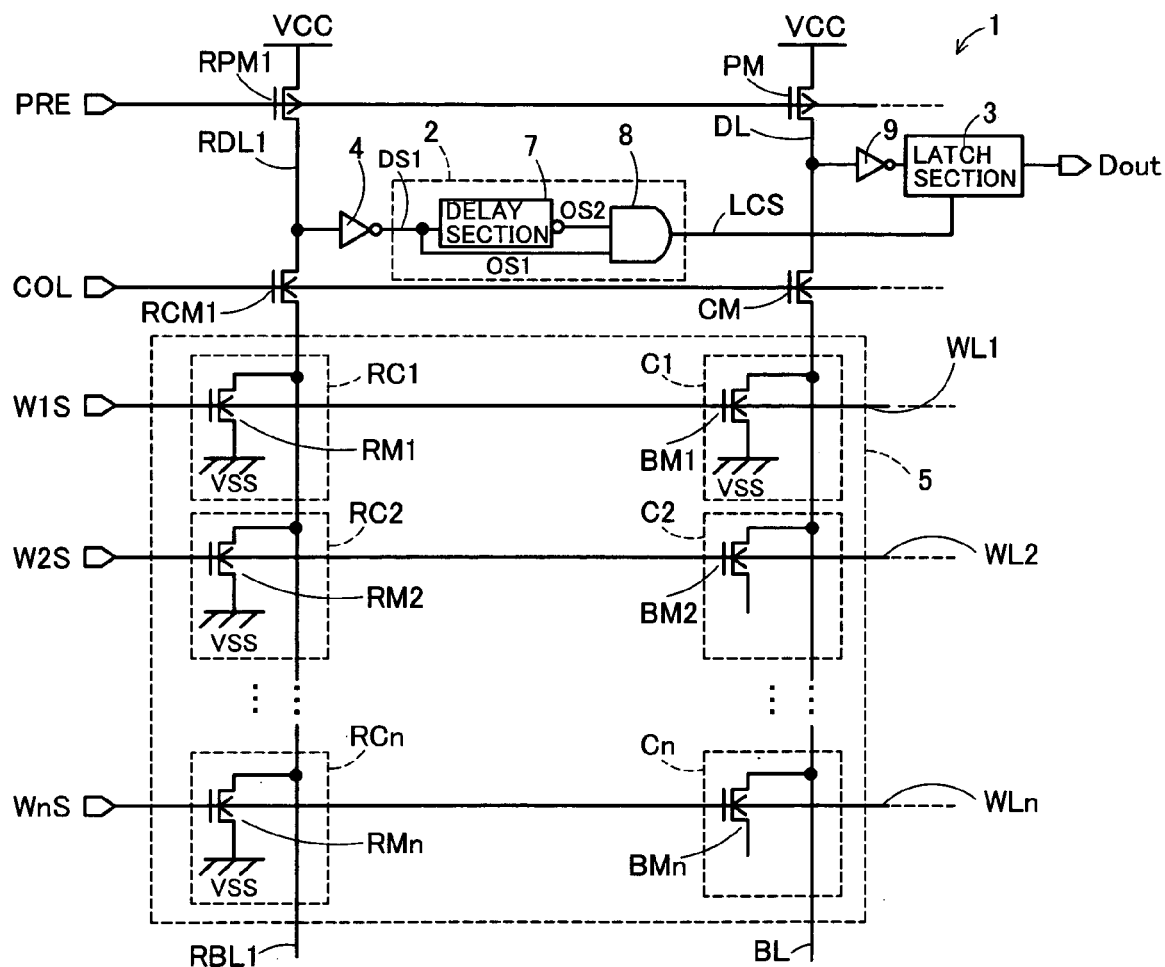
FIG. 1 is a diagram showing a read-only memory ("ROM") circuit (1) according to a first embodiment of the invention.

Practical embodiments related to semiconductor memory devices of the invention will be described herebelow with reference to FIGS. 1 to 7. To begin with, a first embodiment will be described with reference to FIGS. 1 to 3. Referring to FIG. 1, a ROM circuit 1 shown therein has a latch controller section 2, a latch section 3, and a cell section 5. Additionally, the ROM circuit 1 has a regular bit line BL and a regular data line DL; a first replica bit line RBL1 and a first replica data line RDL1; and first to n-th word lines WL1 to WLn (n=natural number). The regular bit line BL and the regular data line DL are interconnected through a transistor CM; and a first replica data line RDL1 and a first replica bit line RBL1 are interconnected through a transistor RCM1. The latch section 3 is connected to individual memory cells C1 to Cn through the regular data line DL and the regular bit line BL. The latch section 3 is controlled corresponding to a detection operation of the latch controller section 2. The latch controller section 2 is an example of a timing detector section according to the invention. The transistor CM and the transistor RCM1 are each set to be conductive (conductive state) when individual voltage values of the regular bit line BL and the replica bit line RBL become the level lower than or equal to a first precharge voltage value PV1.

The latch controller section 2 has a delay section 7 and an AND gate 8. The first replica data line RDL1 is connected to the input terminals of the delay section 7 and AND gate 8 through an inverter 4. An output terminal of the delay section 7 is connected to an input terminal of the AND gate 8, and the output terminal of the AND gate 8 is connected to the latch section 3. The regular data line DL is connected to the latch section 3 through an inverter 9. Data Dout is output from the latch section 3.

The memory cells C1 to Cn are connected to the regular bit line BL, and replica memory cells RC1 to RCn are connected to the first replica bit line RBL1. The source of the memory cell transistor BM1 of the memory cell C1 is coupled to a ground voltage VSS, in which data "0" is retained corresponding to the memory-cell current value. The sources of memory cell transistors BM2 and BMn of the memory cells C2 and Cn are set to a floating state, in which data "1" is retained corresponding to the memory-cell current value. The sources of replica memory cell transistors RM1 to RMn of the replica memory cells RC1 to RCn are all coupled to the ground voltage VSS. The memory cells C1 to Cn correspond to replica memory cells RC1 to RCn, respectively.

Figure 2:
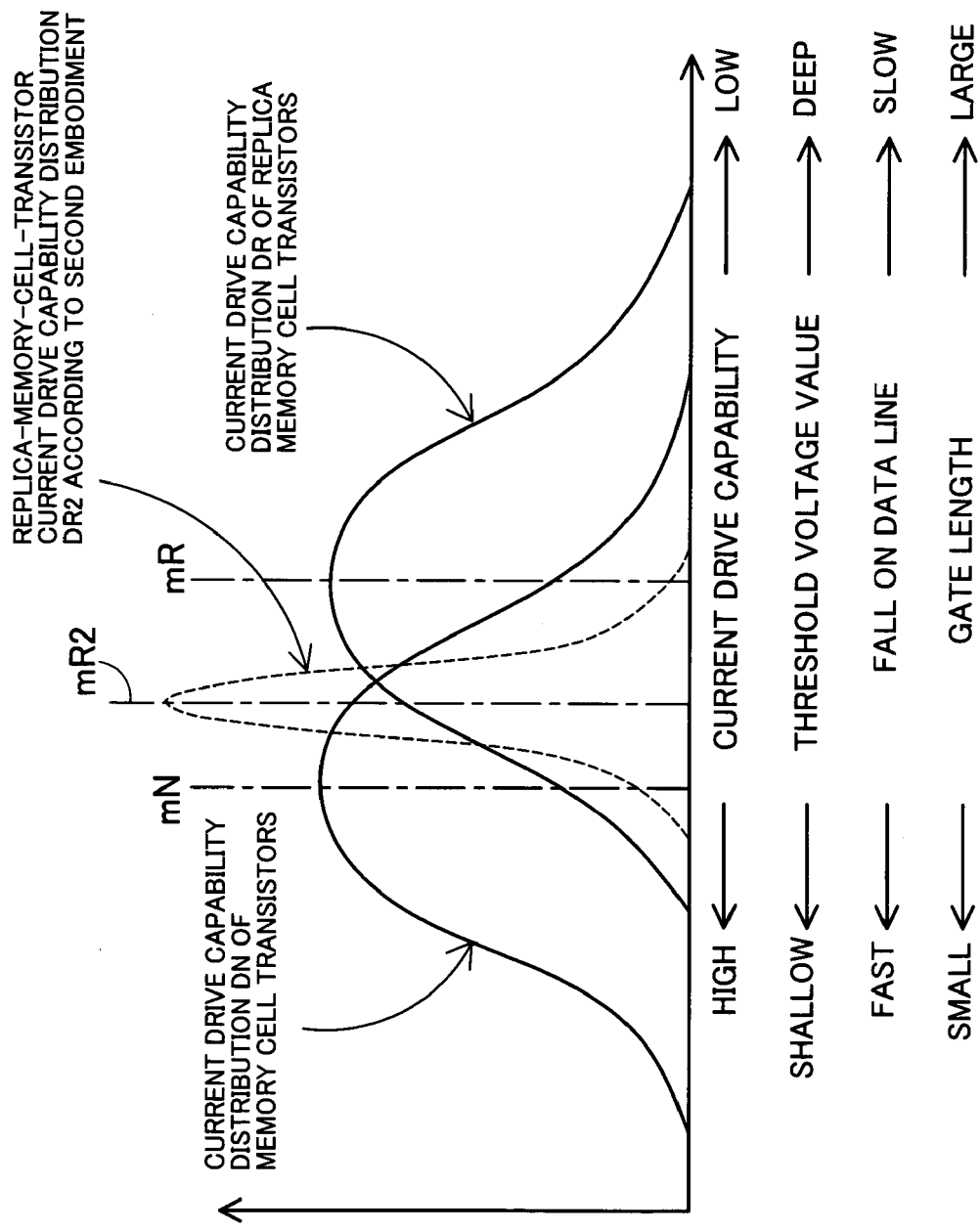
FIG. 2 is a diagram showing current drive capability distributions of memory cell transistors and replica memory cell transistors.

With reference to FIG. 2, a distribution center mR of a current drive capability distribution DR of the replica memory cell transistors RM1 to RMn is set lower than a distribution center mN of a current drive capability distribution DN of the memory cell transistors BM1 to BMn. That is, the current drive capabilities of the individual replica memory cells are set lower than the current drive capabilities of the individual memory cells.

The current drive capabilities in this case are the capabilities of the replica memory cell transistors RM1 to RMn and the capabilities of the memory cell transistors BM1 to BMn. In the embodiment case, a method is used in which threshold voltage value RVth of the replica memory cell transistors RM1 to RMn is set deeper than a threshold voltage value Vth of memory cell transistors BM1 to BMn, whereby to cause a shift in the current drive capability. As the threshold voltage value Vth becomes deeper, the current drive capability decreases. Concurrently, a post-precharge amount of charge to be drawn from a first replica bit line PBL1 is reduced, and a post-precharge voltage value on the line becomes higher than a specified value, as described below. On the other hand, the threshold voltage value Vth becomes shallower, the current drive capability is increased. Concurrently, the post-precharge amount of charge to be drawn from the first replica bit line RBL1 is increased, and the post-precharge voltage value becomes lower than the specified value.

In order to change the depth (level) of the threshold voltage value Vth, the gate-length dependence of the threshold voltage value Vth, for example, is used. More specifically, the gate length of the replica memory cell transistor is set to a replica-memory-cell-transistor dedicated reference gate length that is a longer value than the gate length of the memory cell transistor. Thereby, in accordance with the gate length dependence of the threshold voltage value Vth, the threshold voltage value Vth of the replica memory cell transistors RM1 to RMn can be set deeper than the threshold voltage value Vth of the memory cell transistors BM1 to BMn.

Alternative method may be used to change the depth of the threshold voltage value Vth. This method is such that an ion-doping amount in the manufacture of the memory cell transistors BM1 to BMn is changed with respect to the ion-doping amount in the manufacture of the replica memory cell transistors RM1 to RMn, whereby to change the depth of the threshold voltage value Vth.

By reference to a timing diagram shown in FIG. 3, operation of the ROM circuit 1 will be described herebelow the memory cell C1 (memory data "0") is read out in a time period P1, and the memory cell C2 is read out in a period P2 (memory data "1"). In the period P1 a first word line selection signal W1S is driven to a high level (power source voltage VCC). Thereby, the memory cell transistor BM1 and replica memory cell transistor RM1 connected to the first word line WL1 are selected and set to the conductive state. Concurrently, a column selection signal COL is driven to the high level, whereby the transistors CM and RCM1 are driven to the conductive state. In the period from time T10 to T11, a precharge signal PRE is driven to the low level, and transistors PM and RPM1 are driven to the conductive state, whereby the regular data line DL and the first replica data line RDL1 are charged to the level of the power source voltage VCC.

The post-precharge voltage values of the regular bit line BL and the first replica bit line RBL1 vary depending on the current drive capabilities of the memory cell transistors BM1 to BMn and the current drive capabilities of the replica memory cell transistors RM1 to RMn. As has been described above (FIG. 2), the distribution center mR of the replica memory cell transistors RM1 to RMn is set lower than the distribution center mN of the current drive capabilities of the memory cell transistors BM1 to BMn. Accordingly, there is the high probability that the current drive capabilities of the replica memory cell transistors RM1 to RMn are lower than the current drive capabilities of the memory cell transistors BM1 to BMn.

Figure 3:
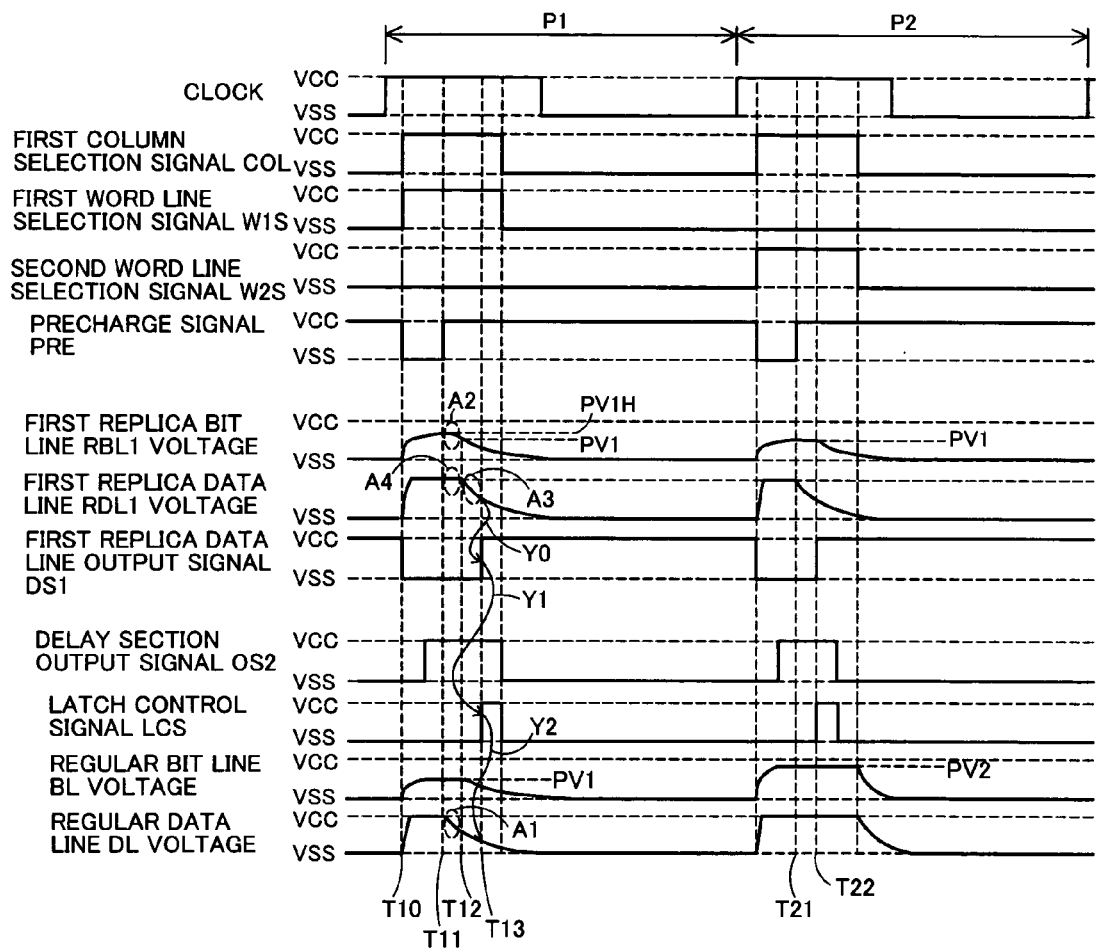
FIG. 3 is a timing diagram of the ROM circuit (1)

With reference to FIG. 3, the following will describe a case where the current drive capability of the replica memory cell transistor RM1 is lower than the current drive capability of the memory cell transistor BM1 in accordance with the probability described above. At the precharge completion time (time T11), the regular bit line BL is precharged to a voltage value at the level of the specified value or the first precharge voltage value PV1. Concurrently, RBL1 becomes a first precharge high voltage value PV1H (value higher than the first precharge voltage value PV1). This occurs for the following reason. The current drive capability of the replica memory cell transistor RM1 is lower than the current drive capability of the memory cell transistor BM1. Accordingly, the amount of charge drawn from the first replica bit line RBL1 is less than the amount of charge drawn from the regular bit line BL and the precharge-completion-time voltage value of the first replica bit line is balanced with the voltage value higher than the first precharge voltage value PV1.

At time T11 the voltage value of the first replica bit line RBL1 is set to the first precharge high voltage value PV1H, whereby the transistor RCM1 is set to a substantially non-conductive state. The charge is then drawn by the replica memory cell transistor RM1 from the first replica bit line RBL1, whereby the voltage value of the first replica bit line RBL1 is reduced (region A2). At this time, since the charge is drawn by the low-capability replica memory cell transistor RM1, the fall rate of the voltage value of the first replica bit line RBL1 in a region A2 is significantly decreased. At time T12, when the voltage value of the first replica bit line RBL1 is decreased to the first precharge voltage value PV1, the transistor RCM1 is driven to the conductive state, whereby charge redistribution takes place between the first replica data line RDL1 and the first replica bit line RBL1. In this event, the charge is drawn from the first replica data line RDL1, the voltage value of the first replica data line RDL1 begins to fall from the level of the power source voltage VCC after time T12 (region A3).

When the voltage value of the first replica data line RDL1 has decreased to ½ VCC (time T13), a first replica data line output signal DS1 (FIG. 1) having been output from the inverter 4 is inverted from the low level to the high level (arrow Y0 in FIG. 3). A delay section output signal OS2 is the high level since it is the delayed and inverted output produced from the first replica data line output signal DS1 at time T13. As such, the high level signals are input to the AND gate 8, and a high level latch control signal LCS is output from the AND gate 8 (arrow Y1). More specifically, in the period from time T11 to T12, the voltage-value fall start time on the first replica data line RDL1 is delayed (region A4) whereby to delay the transmission timing of the latch control signal LCS.

Concurrently, since the regular bit line BL is set to the first precharge voltage value PV1, the transistor CM (FIG. 1) is driven to the conductive state. Accordingly, in time T11, charge redistribution takes place between the regular data line DL and the regular bit line BL, so that the voltage value on the regular data line DL begins to decrease immediately after the passage of time T11 (region A1). That is, no delay occurs in the voltage-value fall start time of the voltage value on the regular data line DL. Then, at time T13, when a high level latch control signal LCS is input to the latch section 3, data (memory data "0") having been read out to the regular data line DL is latched (arrow Y2) with the input signal being used as a trigger.

Accordingly, the voltage-value fall start (time T11) of the regular data line DL indicative of data "0" takes place earlier than the voltage-value fall start (time T12) of the first replica data line RDL1 that determines the latch timing. Thereby, at a time point (time T13) at which the high level latch control signal LCS is output, since the voltage value of the regular data line DL is sufficiently reduced, data "0" appearing in the regular data line DL is securely read out. This makes it possible to prevent such readout error in which data "0" is not timely read out, but unintended data "1" is read out. Consequently, the defective-product occurrence rate for semiconductor memory devices can be reduced, thus contributing to the improvement in production yield.

As described above, according to the circuit configuration of the first embodiment, the distribution center mR of the current drive capabilities of the replica memory cell transistors RM1 to RMn are set lower than the distribution center mN of the current drive capabilities of the memory cell transistors BM1 to BMn. As such, even when a combination of cases occurs in which the fluctuation occurs in the direction along which the current drive capability of the replica memory cell transistor becomes higher and the fluctuation occurs in the direction along which the current drive capability of the memory cell transistor becomes lower, the configuration can reduce the occurrence probability of an event where the current drive capability of the replica memory cell transistor becomes higher and the current drive capability of the memory cell transistor becomes lower. This enables reducing the occurrence probability of an event where the precharge-completion-time voltage value on the regular bit line BL becomes higher than the voltage value on the precharge-completion-time first replica bit line RBL1 whereby to cause a delay in the voltage-fall start time on the regular data line DL with respect to the transmission timing of the latch control signal LCS. This consequently makes it possible to prevent the event where timely readout of data "0" appearing in the regular data line DL cannot be performed whereby to cause the data readout error.

The transistor property fluctuation causing such problems as the data readout error and the access time increase becomes greater or more prominent as the degree of device miniaturization increases. In addition, the increase in the transistor property fluctuation increases the occurrence probability of the data readout error, presenting an impediment for device miniaturization. According to the first embodiment, however, the distribution center mR of the current drive capabilities of the replica memory cell transistors RM1 to RMn is set lower than the distribution center mN of the current drive capabilities of the memory cell transistors BM1 to BMn. Thereby, even in a widened distribution of the current drive capability, the data readout error can be prevented. Consequently, further device miniaturization can be implemented, thereby making it possible to implement reductions in the circuit size, cost, and consumptive current.

Figure 4:
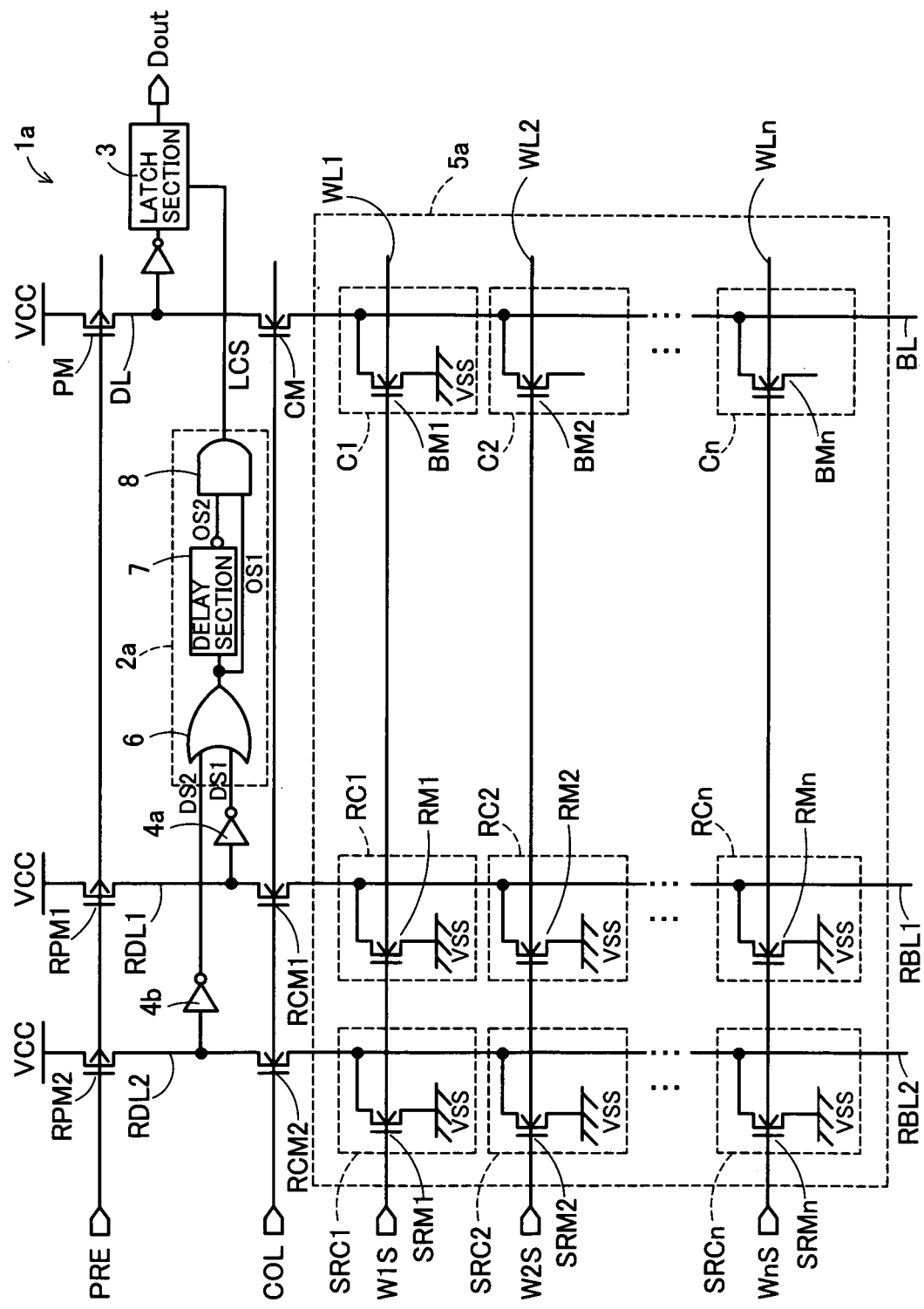
FIG. 4 is a diagram showing a ROM circuit (1a) according to a second embodiment.
Figure 5:
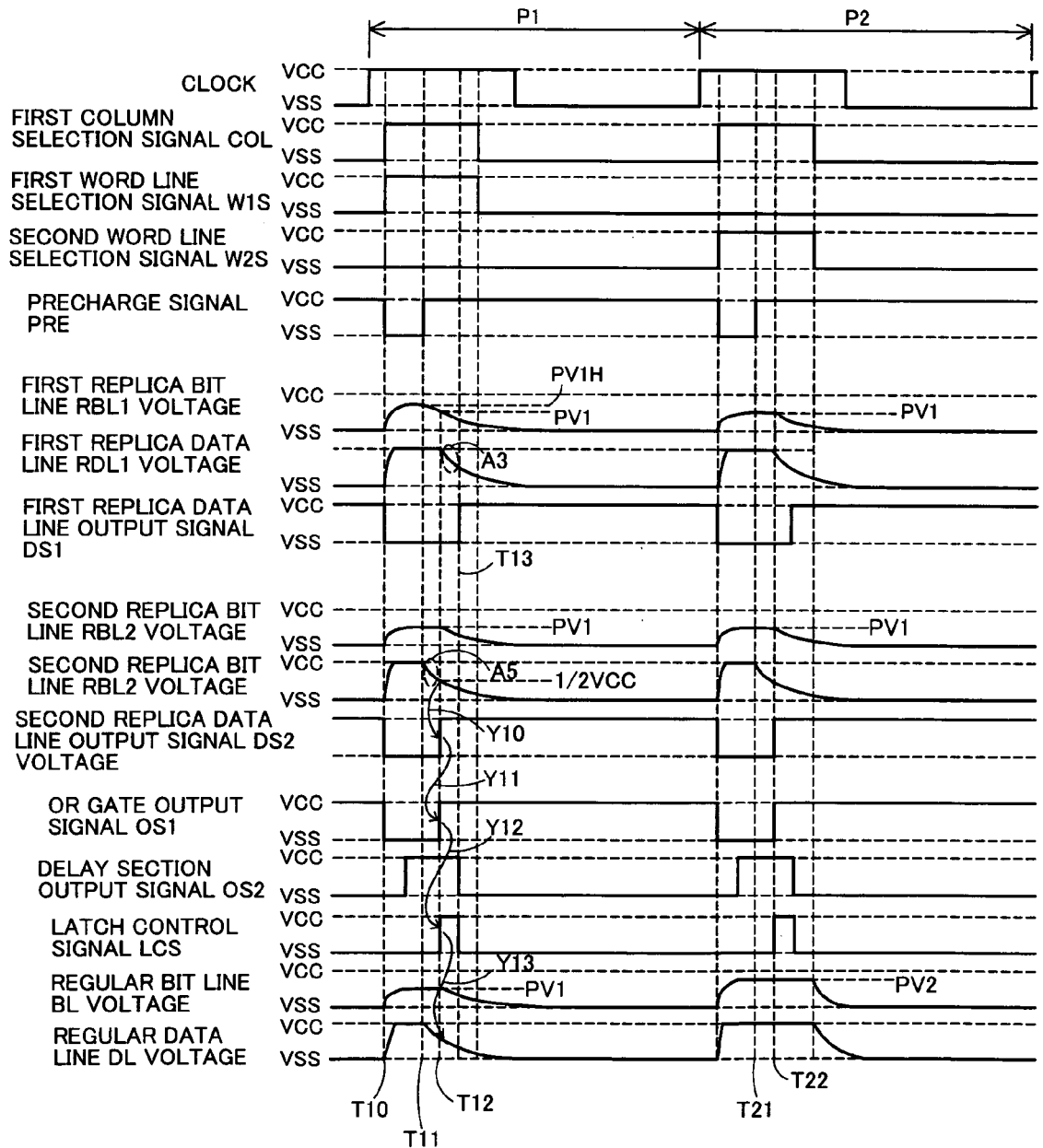
FIG. 5 is a timing diagram of the ROM circuit (1a)

Referring to FIGS. 4 and 5, a second embodiment of the invention will now be described herebelow. In addition to the components of the ROM circuit 1 (FIG. 1) of the first embodiment, a ROM circuit 1a of the second embodiment shown in FIG. 4 has a cell section 5a provided with an additional second replica bit line RBL2. Replica memory cells SRC1 to SRCn are connected to the second replica bit line RBL2. The ROM circuit 1a has a latch controller section 2a as a replacement for the latch controller section 2. The latch controller section 2a is an example of the timing detector section of the invention. Replica memory cells RC1 and SRC1 are provided corresponding to the memory cell C1, and replica memory cells RC2 and SRC2 are provided corresponding to the memory cell C2. In this manner, replica memory cells RCn and SRCn are provided corresponding to the memory cell Cn. The replica bit line RBL1 is provided and connected to each of the replica memory cells RC1 to RCn. The replica bit line RBL2 is provided and connected to each of the replica memory cells SRC1 to SRCn. The respective replica bit lines RBL1 and RBL2 are connected to the latch controller section 2a through the first replica data line RDL1 and a second replica data line RDL2. Other portions of the configuration are similar to those of the ROM circuit 1 of the first embodiment, so that detailed descriptions thereof are omitted herefrom.

The latch controller section 2a has an OR gate 6, delay section 7, and AND gate 8. The first replica data line RDL1 is connected to the OR gate 6 through an inverter 4a, and the second replica data line RDL2 is connected to the OR gate 6 through an inverter 4b. The OR gate 6 is connected to the input terminals of the delay section 7 and the AND gate 8. The output terminal of the delay section 7 is connected to the input terminal of the AND gate 8.

In a similar manner to that in the first embodiment, in the ROM circuit 1a of the second embodiment, a distribution center mR (FIG. 2) of the current drive capabilities of the replica memory cell transistors RM1 to RMn and the current drive capabilities of the replica memory cell transistors SRM1 to SRMn is set lower than the distribution center mN of the current drive capabilities of the memory cell transistors BM1 to BMn. Operation of the ROM circuit 1a will be described below with reference to an example case. The example case is assumed such that the current drive capability of the replica memory cell transistor RM1 connected to the first replica bit line RBL1 is lower than the current drive capability of the memory cell transistor BM1, and concurrently, the current drive capability of the replica memory cell transistor SRM1 connected to the second replica bit line RBL2 is assumed identical to the current drive capability of the memory cell transistor BM1.

With reference to FIG. 5, the current drive capacities of the memory cell transistor BM1 and the replica memory cell transistor SRM1 are identical to each other, so that the regular bit line BL and the second replica bit line RBL2 at a precharge-completion-time point (time T11) are both precharged to the first precharge voltage value PV1. However, since the current drive capability of the replica memory cell transistor RM1 is low, the precharge-completion-time voltage value of the first replica bit line RBL1 is set to the first precharge high voltage value PV1H (value higher than the first precharge voltage value PV1). Consequently, the voltage-fall start time of the voltage value (at time T12 in a region A3) on the first replica data line RDL1 is later than the voltage-fall start time of the voltage value (at time T11 in a region A5) on the second replica data line RDL2.

When the voltage value of the second replica data line RDL2 has decreased to ½ VCC (time T12), a second replica data line output signal DS2 having been output from the inverter 4b (FIG. 4) is inverted from the low level to the high level (arrow Y10). Concurrently, at time T12 the first replica data line output signal DS1 is the low level. As such, the high-level second replica data line output signal DS2 and the low-level first replica data line output signal DS1 are input to the OR gate 6. An OR gate output signal OS1 having been out from the OR gate 6 is set to the high level (arrow Y11), and is then input to the delay section 7. A delay section output signal OS2, which is a delayed and inverted output produced from the second replica data line output signal DS2 [o2], is output from the delay section 7. Thus, at time T12 the two high-level signals are input to the AND gate 8, so that a high level latch control signal LCS is output from the AND gate 8 (arrow Y12). Then, at time T12, with the rising edge of the latch control signal LCS being used as a trigger, data "0" having read out to the regular data line DL is latched in the latch section 3 (arrow Y13).

Since the OR gate 6 is thus used in the latch controller section 2a, the latch control signal LCS can be automatically transmitted from the latch controller section 2a at the time point (time T12) at which even one of the first replica data line RDL1 and the second replica data line RDL2 has decreased to ½ VCC. More specifically, the transmission timing of the latch control signal LCS can be determined in accordance with the operation of one of the multiple replica bit lines that decreases the voltage value to the predetermined voltage value at the earliest time.

The following will describe effects and advantages of the embodiment. Replica memory cells fastest in readout operation are selected from the multiple replica memory cells connected to the multiple replica bit lines, whereby to enable obtaining the operation of narrowing the distribution itself in the current drive capabilities of the replica memory cell transistors (that is, transistor property fluctuation). More specifically, as represented by the replica-memory-cell-transistor current drive capability distribution DR2 shown in FIG. 2 of the second embodiment, the inter-replica-memory-cell-transistor current drive capability distribution (that is, transistor property fluctuation) can be narrowed and the distribution center can be shifted to an optimal position (i.e., shifted from the distribution center mR to the distribution center mR2) not causing problematic phenomena such as data readout error and access time increase. Thereby, the occurrence probability of the delay in the transmission timing of the latch control signal LCS can be reduced, so that the data readout error can be prevented, and the access time increase can be prevented.

In proportion to the increase in the number of replica bit lines RBL and replica data lines RDL so as to increase the number of replica memory cells that are provided corresponding to individual memory cells, the distribution of the current drive capabilities of replica memory cell transistors (that is, transistor property fluctuation) can be further narrowed, and the distribution thereof can be shifted toward the higher fall rate of the voltage values of the replica bit lines. Thereby, the occurrence probability of late transmission timing of the latch control signal LCS can be reduced, and hence the access time can be further reduced. The number of replica memory cells to be provided corresponding to memory cells can be selected to be optimal in accordance with, for example, specified values of the circuit size and access time.

In the conventional semiconductor memory device, the inter-replica-memory-cell-transistor current drive capability distribution itself cannot be narrowed. As such, for example, the delay device is provided or the gate threshold value of the inverter is adjusted to delay the transmission timing of the latch control signal, whereby to provide the allowance time for the delay in the operation of the regular bit line BL and to prevent the data readout error. In this case, a problem occurs in that if there is a transistor having an extremely low current drive capability such as to correspond the foot of the current drive capability distribution, the access time is thereby increased. According to the present embodiment, however, the inter-replica-memory-cell-transistor current drive capability distribution itself can be narrowed, and the distribution center can be shifted to the optimal position not causing problematic phenomena such as data readout error and access time increase. Accordingly, to prevent the data readout error, the transmission timing of the latch control signal need not be delayed, so that the access time is not increased. This is an advantageous aspect in comparison to the conventional art.

Figure 6:
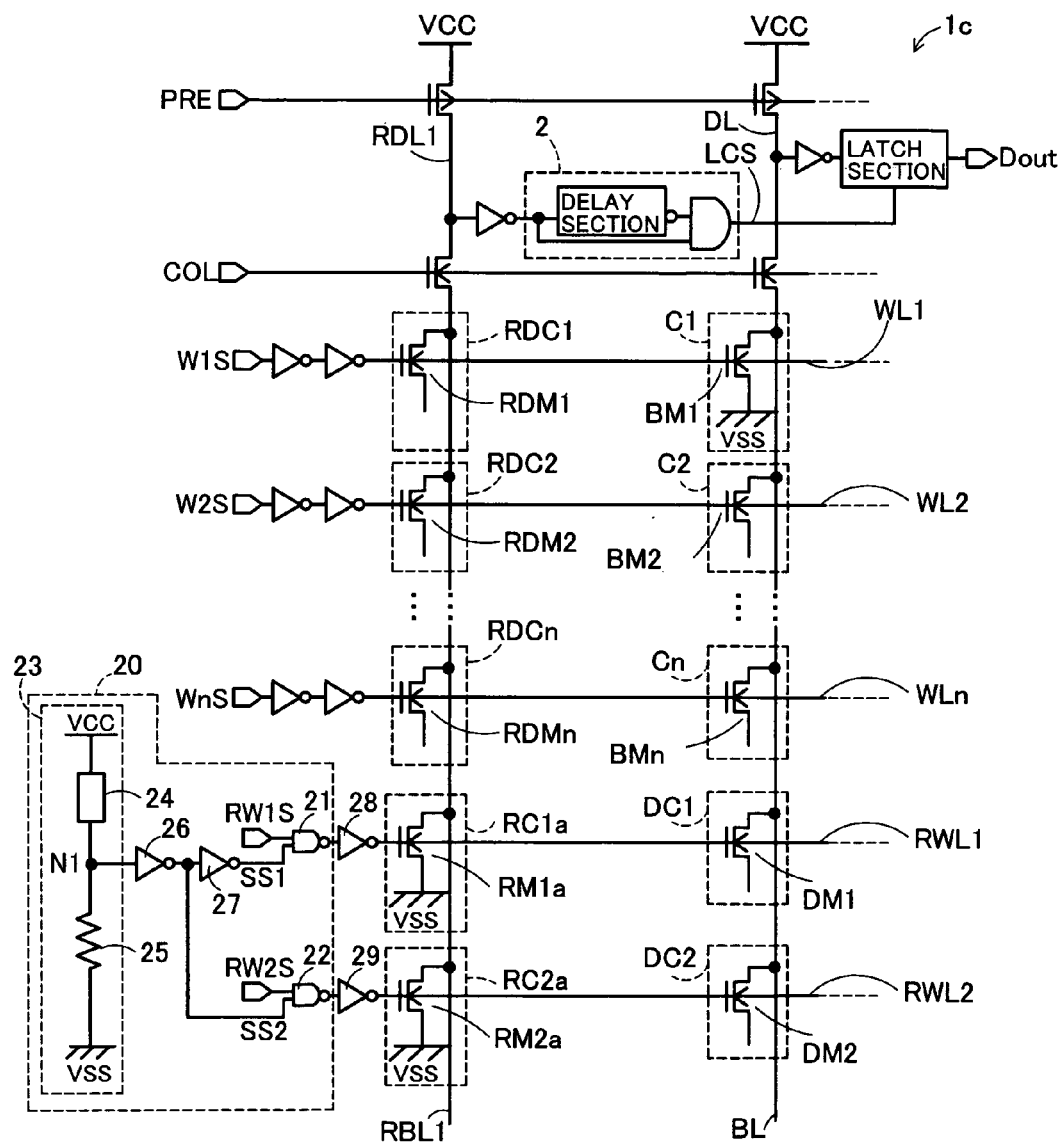
FIG. 6 is a diagram showing a ROM circuit (1c) according to a third embodiment.

Referring to FIG. 6, a third embodiment of the invention will be described herebelow. In addition to the components of the ROM circuit 1 (FIG. 1) of the first embodiment, a ROM circuit 1c of the third embodiment (FIG. 6) has a first replica word line RWL1, a second replica word line RWL2, and a fixed replica memory cell setup circuit 20. Replica memory cells RC1a and RC2a are connected to the first replica bit line RBL1, and replica memory cells RC1a and RC2a are correlated with the memory cells C1 to Cn. The first to n-th word lines WL1 to WLn select the respective memory cells C1 to Cn, and the first and second replica word lines RWL1 and RWL2 select the respective replica memory cells RC1a and RC2a.

Dummy cells RDC1 to RDCn that are the same in configuration and number as the memory cells C1 to Cn are connected to the first replica bit line RBL1. The dummy cells RDC1 to RDCn are, respectively, provided with dummy cell transistors RDM1 to RDMn that each have one end being connected to the first replica bit line RBL1 and the other end being placed in a floating state. The dummy cell transistors RDM1 to RDMn are, respectively, sized identical to the memory cell transistors BM1 to BMn.

A dummy cell DC1 having the same configuration as the replica memory cell RC1a is connected to the first replica word line RWL1, and a dummy cell DC2 having the same configuration as the replica memory cell RC2a is connected to the second replica word line RWL2. The dummy cells DC1 and DC2 are, respectively, provided with dummy cell transistors DM1 and DM2 that each have one end being connected to the regular bit line BL and the other end being placed in a floating state. The dummy cell transistors DM1 and DM2 are, respectively, sized identical to the memory cell transistors BM1 to BMn.

The dummy cells RDC1 to RDCn, DC1, and DC2 are provided to eliminate a line capacity difference between the first replica bit line RBL1 and the regular bit line BL. The source of each of the dummy cells is placed in the floating state. Accordingly, even when the cell transistor is conductive, the current does not flow, so that data readout is not influenced.

The fixed replica memory cell setup circuit 20 has a cell switch section 23. The cell switch section 23 is configured such that a fuse 24 and a load 25 are series connected through a node N1 between the power source voltage VCC and the ground voltage VSS. The node N1 is connected to a NAND gate 22 through an inverter 26. Concurrently, the node N1 is connected to a NAND gate 21 through the inverter 26 and an inverter 27. To the NAND gates 21 and 22, a first replica word line selection signal RW1S and a second replica word line selection signal RW2S are input respectively.

Operation of the ROM circuit 1c will now be described herebelow. After completion of the manufacture of a semiconductor memory device with the ROM circuit 1c being mounted, a functional test of the ROM circuit 1c is conducted using a tester. Firstly, testing is conducted before the fuse 24 is blown or cut. Before blowing of the fuse 24, a high level switching signal SS1 is output from the inverter 27, and is input to the NAND gate 21. Concurrently, a low level switching signal SS2 is output from the inverter 26, and is input to the NAND gate 22. Then, first to n-th word line selection signals W1S to WnS at the high level are input to the circuit. Each time the first to n-th word lines WL1 to WLn are each sequentially selected, the first replica word line selection signal RW1S is input to the NAND gate 21, and a high level signal is output from an inverter 28. Accordingly, the replica memory cell RC1a is selected in synchronization with the selection of each of the memory cells C1 to Cn, so that the replica memory cell for drawing the charge from the first replica bit line RBL1 is fixed as being the replica memory cell RC1a.

As a consequence of the functional test, because of the transistor property fluctuation, the current drive capability of a fixed replica memory cell transistor RM1a becomes higher than the current drive capability of the memory cell transistor. Accordingly, when timely readout of data "0" cannot be performed and the readout error is thereby caused, the replica memory cell to be fixed is switched from the replica memory cell RC1a to the replica memory cell RC2a. More specifically, when the fuse 24 is blown due to, for example, laser or current application, the switching signal SS1 output from an inverter 27 is inverted to the low level, and the switching signal SS2 output from an inverter 26 is inverted to the high level. Then, the high level second replica word line selection signal RW2S is input to the NAND gate 22, and a high level signal is then output from an inverter 29. Accordingly, in synchronization with the selection of each of the memory cells C1 to Cn, the replica memory cell RC2a is selected, thereby the replica memory cell for drawing the charge from the first replica bit line RBL1 is switched from the replica memory cell RC1a to the replica memory cell RC2a for fixation. Thus, the fixed replica memory cell setup circuit 20 has the functionality of setting one of the multiple replica memory cells to be a fixed replica memory cell. After switching of the fixed replica memory cell, the functional test is conducted again. As a consequence, if no readout error occurs, a redundancy-and-recovery (or, redundancy relief) operation is completed.

The following will describe effects and advantages of the embodiment. According to the first embodiment (FIG. 1), when the memory cells C1 to Cn are each selected, the replica memory cells RC1 to RCn respectively corresponding thereto are each selected. In this case, one replica memory cell is not necessarily fixed as a cell for drawing the charge from the first replica bit line RBL1. As such, multiple charge-drawing replica cells exist, so that even when the current drive capability of the replica memory cell transistor of one of the replica memory cells becomes off-specification level, the readout error occurs. This facilitates the circuit to be influenced by the property fluctuation of the cell transistor of the replica memory cell, increasing the occurrence probability of the readout error.

According to the third embodiment (FIG. 6), however, the arrangement is made such that one of the replica memory cells RC1a and RC2a is fixed as a replica memory cell for drawing the charge of the first replica bit line RBL1. With this arrangement, the occurrence of the readout error is determined depending on whether the current drive capability of the replica memory cell transistor of the fixed replica memory cell is the off-specification level or in-specification level. In comparison with the probability that the replica memory cell transistors of all the replica memory cells RC1 to RCn fall in the specification, the probability that the replica memory cell transistor of fixed one of the replica memory cells RC1a and RC2a fall in the specification [o3] is higher.

More specifically, the number of necessary replica memory cells can be reduced by arranging the configuration such that the replica memory cell RC1a or RC2a is correlated to the memory cells C1 to Cn. With the arrangement, the configuration is imparted with immunity to the influence of the property fluctuation of the replica memory cell transistors, thereby enabling reducing, for example, the occurrence probability of the readout error and the occurrence probability of the increased access time. Consequently, the production yield of semiconductor memory devices can be improved.

The following will now describe an example case where the occurrence probability that the current drive capability of the replica memory cell transistor falls within a specification not causing the readout error is 99(%), and 1024 word lines and memory cells are provided. When a charge-drawing replica memory cell is not fixed, replica memory cell transistors of all replica memory cells corresponding to the 1024 memory cells are required to be within the specification. In this case, the nonoccurrence probability of the readout error is substantially 0(%) since it is the 1024th power of the occurrence probability (99 (%)) of one replica memory cell transistor falling within the specification. On the other hand, when one charge-drawing replica memory cell is fixed, the nonoccurrence probability of the readout error is identical to the occurrence probability (99 (%)) of one cell transistor falling within the specification. This proves that when the replica memory cell is fixed, the configuration is imparted with immunity to the influence of the property fluctuation of the cell transistors of the replica memory cells.

In addition, with the fixed replica memory cell setup circuit 20 being provided, one of the replica memory cells RC1a and RC2a can be set as being a fixed replica memory cell. Accordingly, the redundancy and recovery (redundancy relief) operation can be implemented, so that the production yield of semiconductor memory devices with the ROM circuit 1c being mounted can be further improved.

The multiple replica memory cells may include the above-described replica-memory-cell-transistor dedicated reference gate length, in which the gate length is set to increase or decrease in units of a predetermined length with respect to the reference gate length. Thereby, the plurality of replica memory cell transistors are provided that each have a predetermined difference in current drive capability difference with respect to the reference gate length. In addition, with the configuration that selects a replica memory cell transistor having a required current drive capability, the redundancy and recovery (redundancy relief) operation can be implemented securely with even higher probability in accordance with the result of the functional test, thereby enabling the production yield of semiconductor memory devices to be further increased. Of course, all the multiple replica memory cell transistors may be created in accordance with the replica-memory-cell-transistor dedicated reference gate length as a set value.

Figure 7:
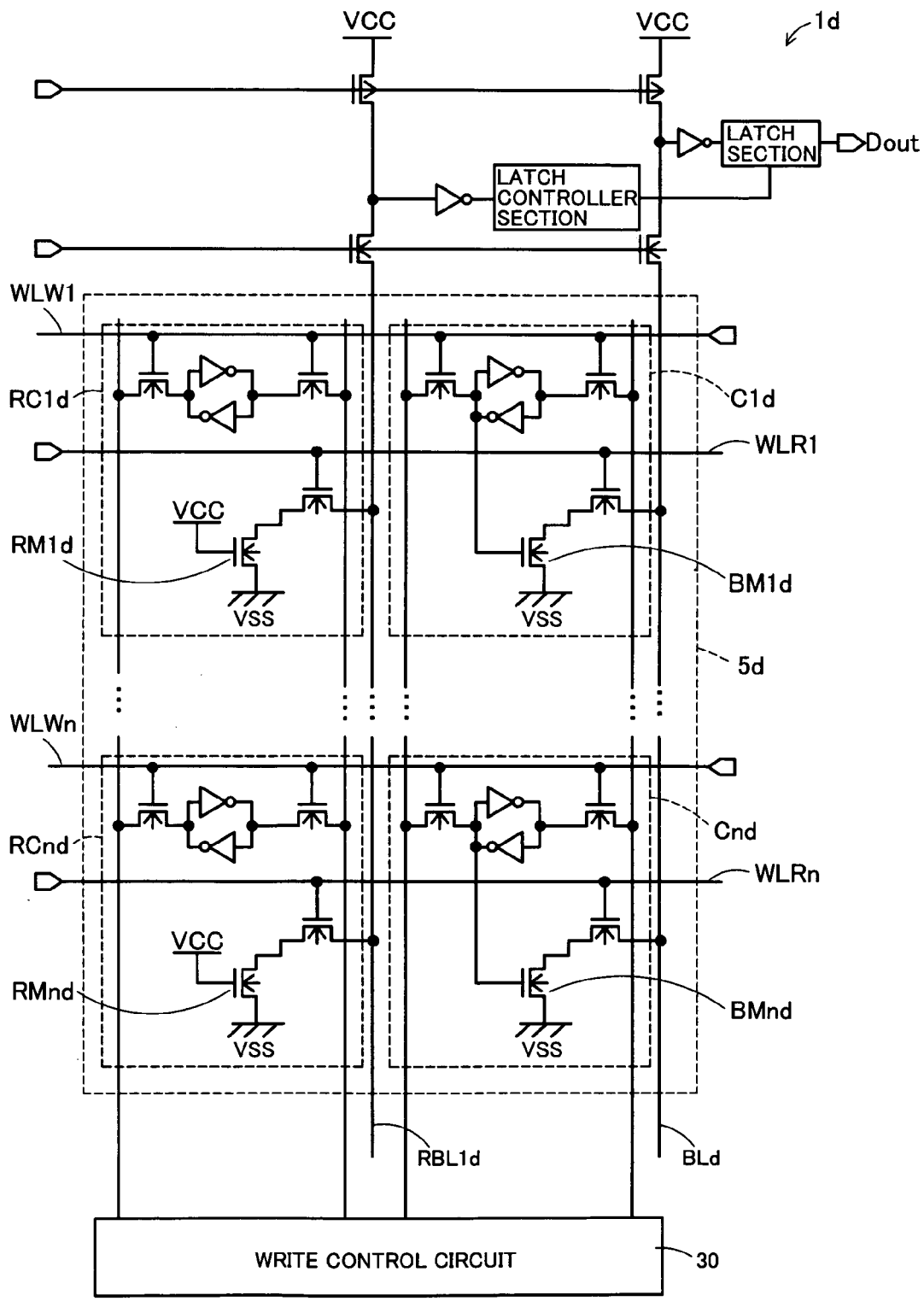
FIG. 7 is a diagram showing a portion of a multiport static random access memory ("SRAM") (1d) having read-only ports.
Figure 8:
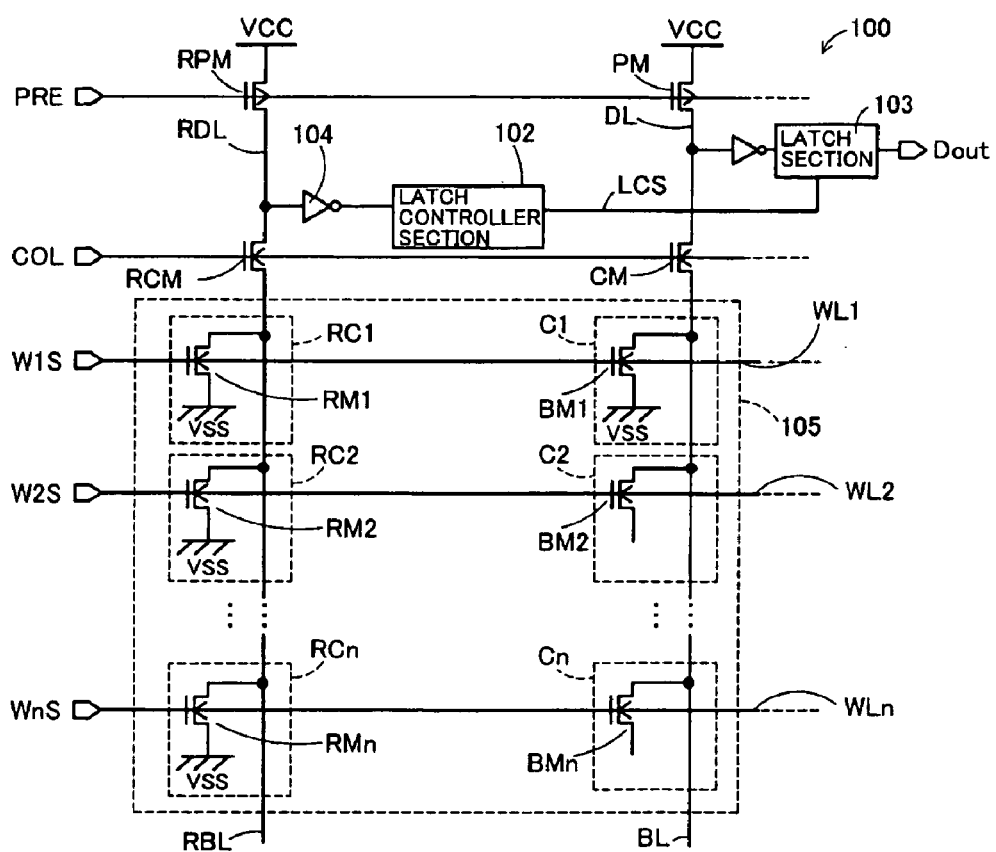
FIG. 8 is a diagram showing a conventional ROM circuit (100) using replica bit lines.
Figure 9:
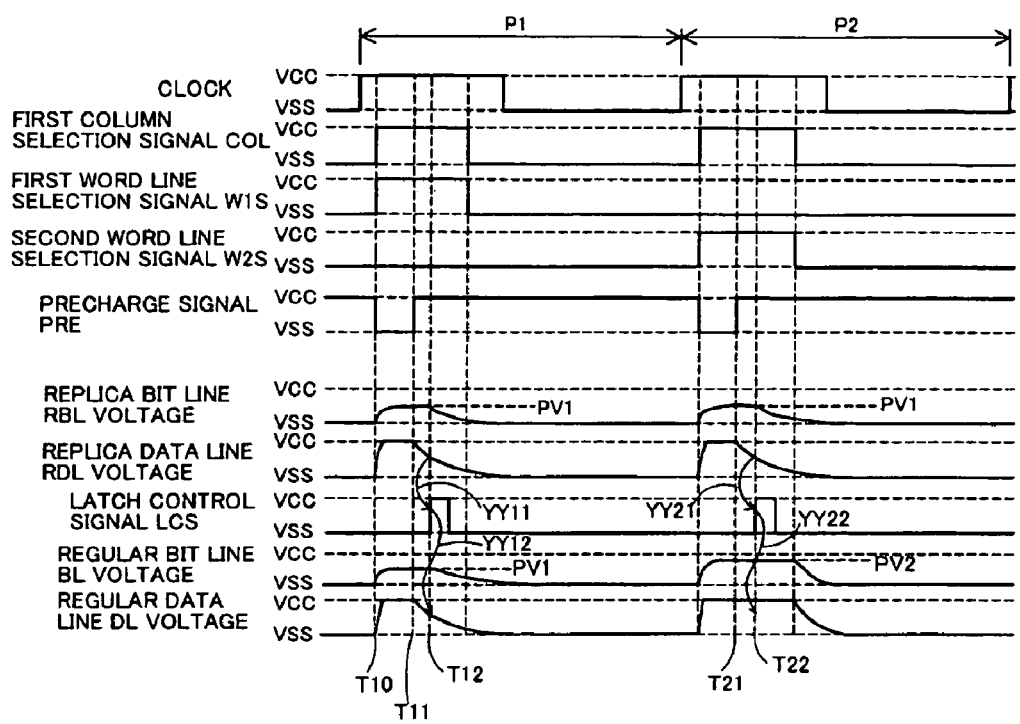
FIG. 9 is a timing diagram (1 of 3) of the conventional ROM circuit (100)
Figure 10:
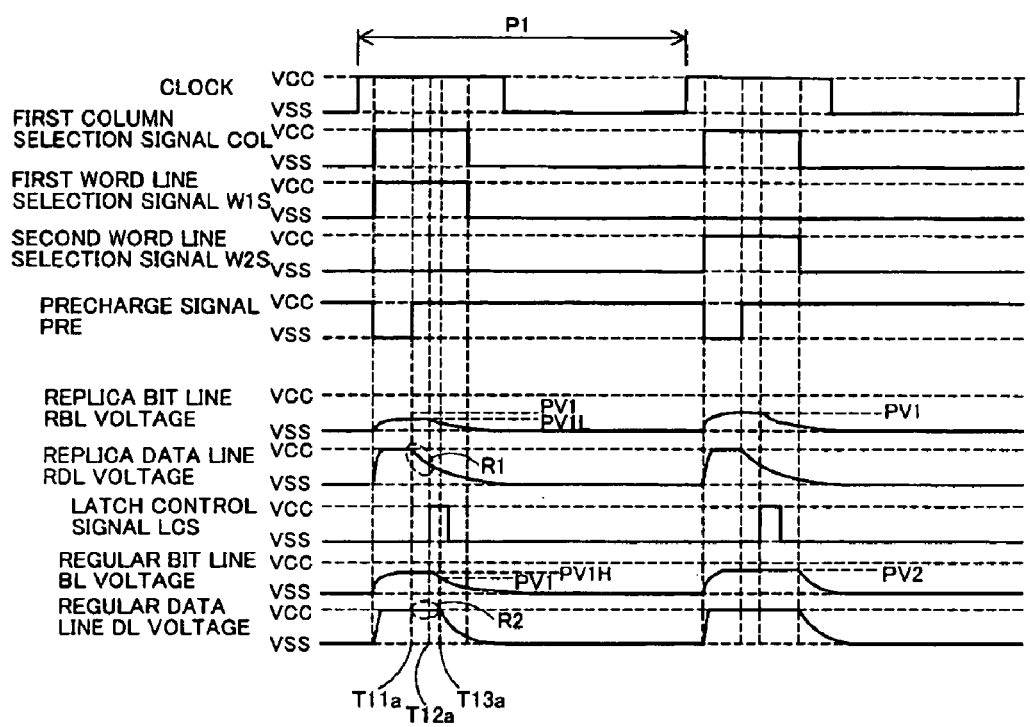
FIG. 10 is a timing diagram (2 of 3) of the conventional ROM circuit (100)
Figure 11:
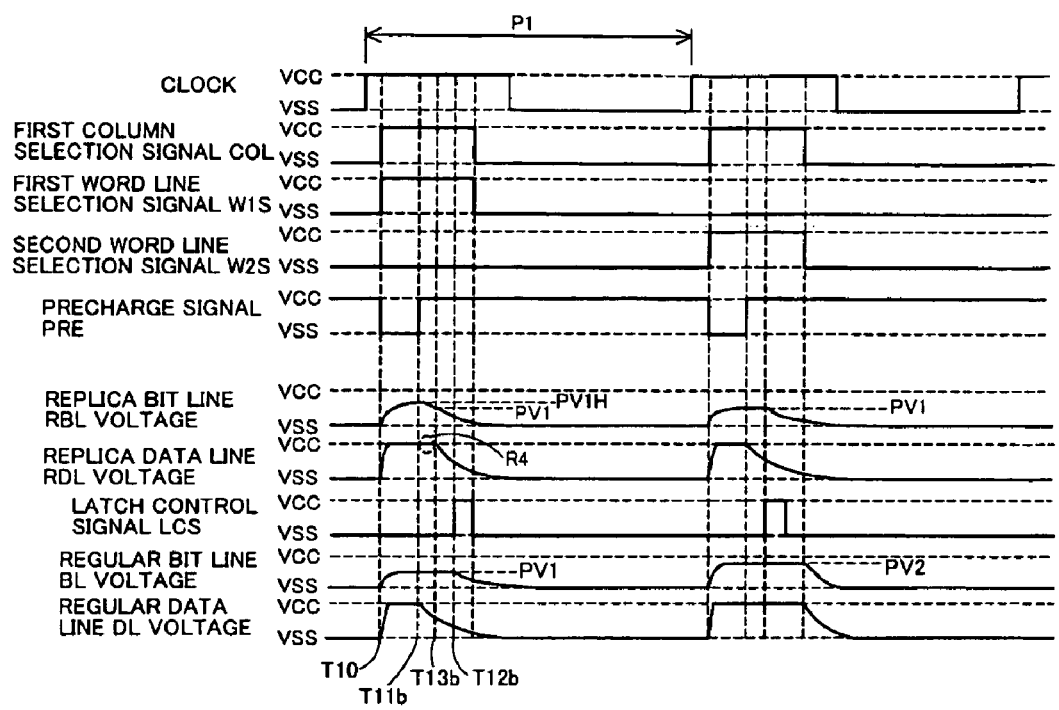
FIG. 11 is a timing diagram (3 of 3) of the conventional ROM circuit (100).

Referring to FIG. 7, a fourth embodiment of the invention will be described herebelow. FIG. 7 is a diagram showing a portion of a multiport SRAM 1d having read-only ports. Since a method of performing the readout with single-bit lines is employed, the circuit configuration is advantageous with respect to the circuit size when a large number of ports are provided. The multiport SRAM 1d shown in FIG. 7 has a cell section 5d, which has a configuration different from the cell section of the ROM circuit 1 (FIG. 1) of the first embodiment, and a write control circuit 30. In addition, the multiport SRAM 1d has first to n-th read side word lines WLR1 to WLRn and first to nth write side word lines WLW1 to WLWn.

The sources of memory cell transistors BM1d to BMnd of memory cells C1d to Cnd are connected to the ground voltage VSS. The memory cell transistors BM1d to BMnd are connected to the ground voltage VSS in the conductive state, so that memory data "0" is retained therein; and memory data "1" is preserved therein in the nonconductive state. The power source voltage VCC is applied to all the gates of replica memory cell transistors RM1d to RMnd of replica memory cells RC1d to RCnd, whereby all the transistors are driven to the conductive state. Other configurations are similar to those of the ROM circuit 1 of the first embodiment, so that detailed descriptions thereof will be omitted herefrom.

Also in the multiport SRAM 1d, as described in the first embodiment, the distribution center of the current drive capabilities of the replica memory cell transistors RM1d to RMnd is set lower than the distribution center of the current drive capabilities of the memory cell transistors BM1d to BMnd. As such, even when the fluctuation occurs in the direction along which the current drive capability of the replica memory cell transistor becomes higher than the current drive capability of the memory cell transistor, the configuration can reduce the occurrence probability of the event where the current drive capability of the replica memory cell transistor becomes higher than the current drive capability of the memory cell transistor. This enables preventing the event where the data readout cannot be timely performed whereby to cause the data readout error.

Also in the multiport SRAM 1d, as described and shown in the second embodiment, the configuration may of course be arranged to have a plurality of replica bit lines. This arrangement enables increasing the probability of the existence of a replica data line that is fast in voltage-value fall start timing, reduction in the occurrence probability of delayed transmission timing of the latch control signal can be prevented, and the occurrence of access delay can be prevented.

The present invention is not limited to the embodiments, but various modifications and changes may of course be made without departing from the spirit and scope of the invention. While the third embodiment is arranged such that the production yield of semiconductor memory devices can be improved by performing the redundancy-and-recovery (or, redundancy relief) of the fixed replica memory cell, the embodiment is not limited thereto. The embodiment may be such that, for example, feedback control is performed to cause the current drive capability of a fixed replica memory cell transistor to conform to a predetermined value not causing the data readout error. A specific example of the above may be such that the value of current flowing into the fixed replica memory cell transistor is monitored, and value of a bias voltage to be applied to the gate of the fixed replica memory cell transistor is controlled corresponding to the current value so that the current value falls within a predetermined range. This enables contribution to the improvement in the production yield of semiconductor memory devices.

In addition, while the third embodiment is configured such that the fixed replica memory cell setup circuit 20 has the cell switch section 23 having the fuse 24, the configuration is not limited thereto. For example, the configuration may be such that the cell switch section has a logic circuit to replace the fuse, in which an optimal replica memory cell is selected corresponding to the current drive capability of the replica memory cell.

According to the semiconductor memory device and the control method for the semiconductor memory device, even in the case where the transistor property fluctuation is increased by, for example, device miniaturization, the access time can be prevented from being increased, and the occurrence of the data readout error can be prevented.

What is claimed is:

1. A semiconductor memory device comprising at least one of replica memory cells corresponding to memory cells, wherein in the event of a readout operation for memory data stored corresponding to a value of current in the memory cell, a data readout timing for readout from the memory cell is set in accordance with the readout operation on the corresponding replica memory cell,
   wherein:
   a current drive capability of the replica memory cell is set lower than a current drive capability of the memory cell,
   the semiconductor memory device further comprising:
   a plurality of the replica memory cells for each memory cell, each of the plurality of replica memory cells sharing a word line with the memory cell; and
   a timing detector section that detects the fastest readout operation from readout operations on the plurality of the replica memory cells.

2. The semiconductor memory device according to claim 1, wherein:
   the current drive capability is the capability of a replica memory cell transistor and the capability of a memory cell transistor provided in the replica memory cell and the memory cell, respectively; and
   a threshold voltage value of the replica memory cell transistor is set as being a value deeper than a threshold voltage value of the memory cell transistor.

3. The semiconductor memory device according to claim 2, wherein:
   a gate length of the replica memory cell transistor is set as being a value greater than a value of a gate length of the memory cell transistor.

4. The semiconductor memory device according to claim 1, further comprising a plurality of replica bit lines connected in units of the replica memory cell, wherein:
   the replica bit lines are each connected to the timing detector section.

5. The semiconductor memory device according to claim 4, further comprising a latch section connected to each of the memory cells, wherein:
   the latch section is controlled corresponding to a detection operation of the timing detector section.

6. A semiconductor memory device comprising at least one of replica memory cells corresponding to memory cells, wherein in the event of a readout operation for memory data stored corresponding to a value of current in the memory cell, a data readout timing for readout from the memory cell is set in accordance with the readout operation on the corresponding replica memory cell,
   wherein:
   the semiconductor memory device further comprises a plurality of the replica memory cells which share a bit line with each other, and
   one of the replica memory cells is selected according to a previously defined, predetermined condition.

7. A semiconductor memory device according to claim 6, wherein:
   current drive capabilities of the replica memory cells are different from one another.

8. The semiconductor memory device according to claim 7, wherein:
   the current drive capabilities are the capabilities of replica memory cell transistors provided in the replica memory cells; and
   a threshold voltage value of each of the replica memory cell transistors is different.

9. The semiconductor memory device according to claim 8, wherein:
   a gate length of each replica memory cell transistor is different.

10. The semiconductor memory device according to claim 6, further comprising:
    a word line for selecting each of the memory cells; and
    a replica word line for selecting at least one of the replica memory cells,
    wherein:
    at least one of dummy cells having the same structure as the replica memory cells are provided in the word line; and
    dummy cells having the same structure as the memory cells are provided in the replica word line.

11. The semiconductor memory device according to claim 6, further comprising:
    a bit line for selecting each of the memory cells; and
    a replica bit line for selecting at least one of the replica memory cells,
    wherein:

at least one of dummy cells having the same structure as the replica memory cells are provided in the bit line; and dummy cells having the same structure as the memory cells are provided in the replica bit line.

12. The semiconductor memory device according to claim 6, further comprising:

a word line for selecting each of the memory cells;

a replica word line for selecting at least one of the replica memory cells;

a bit line for selecting each of the memory cells; and a replica bit line for selecting at least one of the replica memory cells, wherein:

at least one of dummy cells having the same structure as the replica memory cells are provided in the word line and the bit line; and dummy cells having the same structure as the memory cell are provided in the replica word line and the replica bit line.

13. A control method for a semiconductor memory device comprising at least one of replica memory cells corresponding to memory cells, wherein in the event of a readout operation for memory data stored corresponding to a value of current in the memory cell, a data readout timing for readout from the memory cell is set in accordance with the readout operation on the corresponding replica memory cell, wherein:

a current drive capability of the replica memory cell is set lower than a current drive capability of the memory cell, the semiconductor memory device further comprises a plurality of the replica memory cells for each memory cell, each of the plurality of replica memory cells sharing a word line with the memory cell, and the method further comprises a step of detecting the fastest readout operation from readout operations on the plurality of the replica memory cells.

14. The control method for a semiconductor memory device according to claim 13, wherein:

the current drive capability is the capability of a replica memory cell transistor provided in the replica memory cell; and a gate voltage of the replica memory cell transistor is determined corresponding to the value of current flowing into the replica memory cell transistor so that the current drive capability falls within a predetermined range.

* * * * *